(12) United States Patent
Harvey

(10) Patent No.: US 7,496,396 B2
(45) Date of Patent: Feb. 24, 2009

(54) METHOD OF CYCLIC MAGNETIC RESONANCE IMAGING

(75) Inventor: Paul Royston Harvey, Eindhoven (NL)

(73) Assignee: Koninklijke Philips Electronics N. V., Eindhoven (NL)

( * ) Notice: Subject to any disclaimer, the term of this patent is extended or adjusted under 35 U.S.C. 154(b) by 344 days.

(21) Appl. No.: 10/528,397

(22) PCT Filed: Aug. 8, 2003

(86) PCT No.: PCT/IB03/03542

§ 371 (c)(1),
(2), (4) Date: Mar. 17, 2005

(87) PCT Pub. No.: WO2004/027443

PCT Pub. Date: Apr. 1, 2004

(65) Prior Publication Data
US 2005/0251022 A1    Nov. 10, 2005

(30) Foreign Application Priority Data
Sep. 18, 2002    (EP) .................................. 02078870

(51) Int. Cl.
A61B 5/05 (2006.01)
(52) U.S. Cl. ........................ 600/410; 324/307; 324/309
(58) Field of Classification Search ............. 128/653.2, 128/653.1, 708, 660; 324/306, 309, 318, 324/324; 600/407, 415, 410, 424; 335/296
See application file for complete search history.

(56) References Cited

U.S. PATENT DOCUMENTS

| 4,791,371 A | 12/1988 | Krol |
| 5,111,144 A | 5/1992 | Kuhn |
| 5,379,766 A * | 1/1995 | McKinnon et al. .......... 600/413 |
| 5,423,315 A | 6/1995 | Margosian et al. |
| 5,636,636 A | 6/1997 | Kuhn et al. |
| 6,064,290 A * | 5/2000 | Xu et al. ..................... 335/296 |

(Continued)

FOREIGN PATENT DOCUMENTS

EP    0 654 675 A1    5/1995

(Continued)

OTHER PUBLICATIONS deZwart, et al.; Design of a SENSE-Optimized High-Sensitivity MRI Receive Coil for Brain Imaging; MRM; 2002; 47:1218-1227.

(Continued)

*Primary Examiner*—Eric F Winakur
*Assistant Examiner*—Lawrence N Laryea

(57) ABSTRACT

The invention provides a method and a magnetic resonance imaging apparatus where cyclic image data acquisition is performed while the patient is continuously moved through the imaging volume provided by the magnetic field. The volume to be imaged is subdivided into sub-volumes. Image data acquisitions are sequentially performed for the sub-volumes. The data acquisition for a given sub-volume is performed by true three-dimensional imaging or by a multi slice imaging method where the sub-volume contains a stack of two-dimensional slices. The sub-volume for which image data acquisition is performed is moved through the magnetic field together with the patient. When the image data acquisition for the sub-volume has been completed, the next image data acquisition starts for the subsequent sub-volume.

18 Claims, 6 Drawing Sheets t(slab 6) = (i + 1) . TR

U.S. PATENT DOCUMENTS

| | | | |
|---|---|---|---|
| 6,369,569 B1* | 4/2002 | Heid | 324/309 |
| 6,529,761 B2* | 3/2003 | Creighton et al. | 600/407 |
| 6,556,011 B1* | 4/2003 | Yui | 324/318 |
| 6,714,010 B2* | 3/2004 | Madore | 324/307 |
| 6,801,034 B2* | 10/2004 | Brittain et al. | 324/309 |
| 6,879,852 B1* | 4/2005 | Mueller | 600/410 |
| 6,897,655 B2* | 5/2005 | Brittain et al. | 324/309 |
| 6,912,415 B2* | 6/2005 | Kruger et al. | 600/410 |
| 7,054,675 B2* | 5/2006 | Ma et al. | 600/410 |
| 7,110,805 B2* | 9/2006 | Machida | 600/415 |
| 7,167,004 B1* | 1/2007 | Kruip | 324/320 |
| 2001/0009369 A1 | 7/2001 | Shimo et al. | |
| 2002/0158632 A1* | 10/2002 | Sodickson | 324/307 |

FOREIGN PATENT DOCUMENTS

| | | |
|---|---|---|
| EP | 1 024 371 A2 | 8/2000 |
| GB | 2 101 327 A | 1/1983 |

OTHER PUBLICATIONS

Pruessmann, K.P., et al.; SENSE: Sensitivity Encoding for Fast MRI; MRM: 1999; 42:952-962.

* cited by examiner t(slab 5) = (i). TR where i = m x n t(slab 5) = (i + 1). TR t(slab 5) = (i + 2). TR t(slab 6) = (0). TR t(slab 6) = (i). TR t(slab 6) = (i + 1). TR

METHOD OF CYCLIC MAGNETIC RESONANCE IMAGING

FIELD OF THE INVENTION

The present invention is related to the field of magnetic resonance imaging (MRI), and more particularly to MRI when a subject is continuously moved through the magnetic field.

BACKGROUND AND PRIOR ART

In many medical diagnostic procedures, it is desirable or even necessary to generate an image representation of a relatively large volume of the subject. U.S. Pat. No. 5,423,315 shows a magnetic resonance imaging system with a thin cylindrical uniform field volume which enables to generate a three-dimensional diagnostic image of an elongated section of a subject by continuously moving the subject through the cylindrical uniform field volume. This is accomplished by varying the RF frequency in accordance with patient movement through the uniform field volume. The frequency of the RF pulse is varied linearly as the patient is shifted along the uniform field volume such that the selected slice position remains constant with respect to the (moving) patient.

This prior art approach is disadvantaged from an image processing perspective. Another disadvantage is that the time which is required for data acquisition is relatively long.

It is therefore an object of the present invention to provide an improved method, computer program product and device for magnetic resonance imaging.

SUMMARY OF THE INVENTION

The present invention provides for an improved method of magnetic resonance imaging which enables cyclic image data acquisition while the subject is continuously moved through the imaging volume provided by a magnetic field. The cyclic data acquisition covers at least two subsequent sub-volumes which are moved through the imaging volume. The data acquisition for a sub-volume is performed by true three-dimensional imaging or by a multislice imaging method where the sub-volume contains a stack of two-dimensional slices.

According to the invention, the subject is moved along a predetermined path through the imaging volume. Often, the predetermined path is a straight line. Such a straight line is usually employed in an MR-system which has a cylindrical magnet. In another embodiment, the predetermined path may be curved. Such a curved predetermined path can be used in a so-called open MR-system, which e.g. has a C-shaped magnet.

Further, the sub-volume may be orientated such that the predetermined path, notably the straight line is essentially perpendicular to the sub-volume. Alternatively, the sub-volume may be orientated such that it is tilted relative to the predetermined path. Notably in MR-cardiac application the sub-volume is preferably tilted relative to the predetermined path so as to account for the orientation of the subject's heart relative to the main axes of the body.

In accordance with a preferred embodiment of the invention the resolution of the magnetic resonance image data acquisition forms the basis for determining the speed of movement of the subject through the magnetic field.

In accordance with a further preferred embodiment of the invention a parallel imaging technique is used in order to increase the image data acquisition speed. This enables to increase the speed of movement of the subject accordingly. Preferably a parallel imaging technique is used which is based on simultaneous reception through multiple receive channels. Preferably a SENSE-type parallel imaging technique is used ("SENSE: Sensitivity Encoding for Fast MRI", Klaas P. Pruessmann, et al., Magnetic Resonance in Medicine 42:952-962 (1999)).

BRIEF DESCRIPTION OF THE DRAWINGS

In the following preferred embodiments of the invention will be described in greater detail by making reference to the drawings in which.

DETAILED DESCRIPTION

Figure 1:
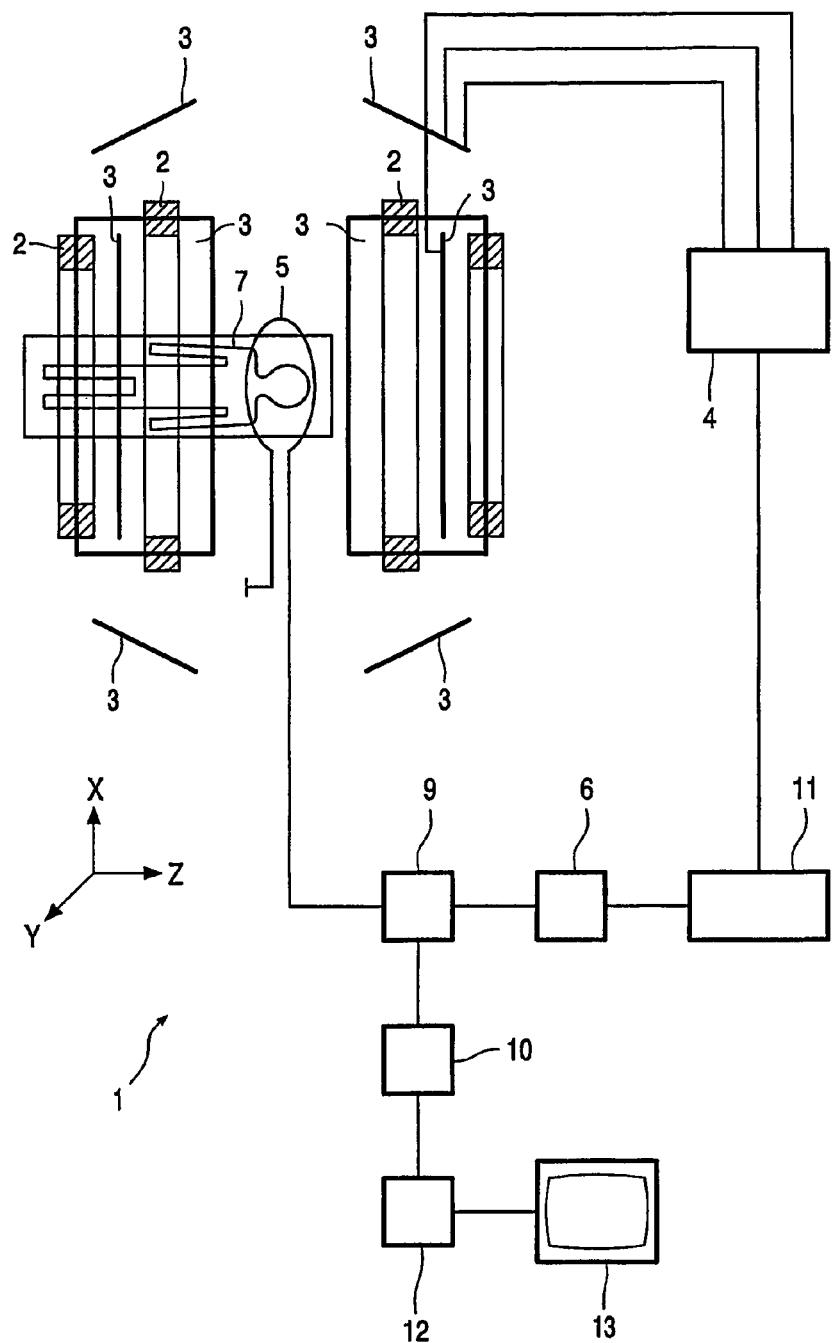
FIG. 1 shows a MR device having a control unit being programmed in accordance with an embodiment of a method of the invention.

FIG. 1 shows a magnetic resonance device 1 which includes a first magnet system 2 for generating a steady magnetic field, and also several gradient coils 3 for generating additional magnetic fields having a gradient in the X, Y, Z directions. The Z direction of the co-ordinate system shown corresponds to the direction of the steady magnetic field in the magnet system 2 by convention. The measuring co-ordinate system x, y, z to be used can be chosen independently of the X, Y, Z system shown in FIG. 1. The gradient coils are fed by a power supply unit 4. An RF transmitter coil 5 serves to generate RF magnetic fields and is connected to an RF transmitter and modulator 6.

A receiver coil is used to receive the magnetic resonance signal generated by the RF field in the object 7 to be examined, for example a human or animal body. This coil may be the same coil as the RF transmitter coil 5. Furthermore, the magnet system 2 encloses an examination space which is large enough to accommodate a part of the body 7 to be examined. The RF coil 5 is arranged around or on the part of the body 7 to be examined in this examination space. The RF transmitter coil 5 is connected to a signal amplifier and demodulation unit 10 via a transmission/reception circuit 9.

The control unit 11 controls the RF transmitter and modulator 6 and the power supply unit 4 so as to generate special pulse sequences which contain RF pulses and gradients. The phase and amplitude obtained from the demodulation unit 10 are applied to a processing unit 12. The processing unit 12 processes the presented signal values so as to form an image by transformation. This image can be visualized, for example by means of a monitor 13.

Preferably the magnetic resonance device 1 has multiple receiver coils for simultaneous reception through multiple receive channels. Such an arrangement enables application of certain parallel imaging techniques such as SENSE.

Receive coils for parallel imaging techniques consist of a number of elements or channels, each working more or less independently and sensitized to a different segment of the field of view (FOV). The coils generally work in combination with a separate, larger transmit coil with uniform excitation profile over the entire FOV. An important advantage of multi-channel receive coils is the fact that they provide high SNR and that, when combined with parallel imaging, they facilitate the use of single-shot MRI techniques such as EPI for applications like diffusion imaging and BOLD functional imaging. "Design of a SENSE-Optimized High-Sensitivity MRI Receive Coil for Brain Imaging", Jacco A. de Zwart, et al., Magnetic Resonance in Medicine 47:1218-1227(2002) shows the design of multi-channel coils for application of such parallel imaging techniques.

Figure 2:
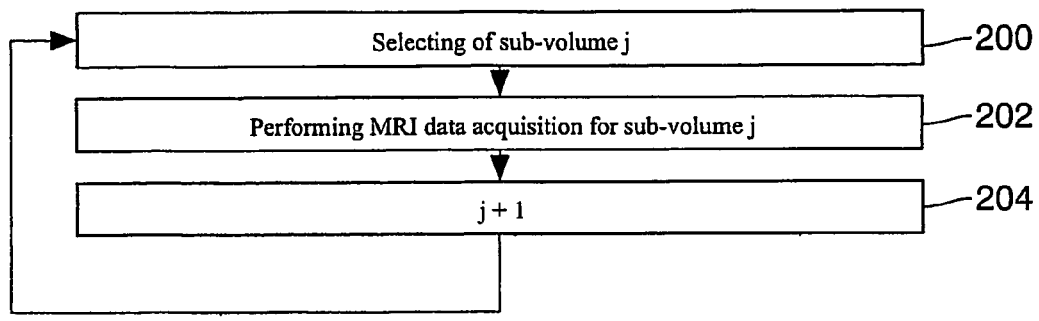
FIG. 2 is illustrative of a method of cyclic magnetic resonance imaging data acquisition.

FIG. 2 is illustrative of a flow chart for performing a cyclic magnetic resonance image data acquisition on a continuously moving patient. In step 200 a first sub-volume j within an imaging volume provided by a magnetic field is selected while the patient is continuously moved through the imaging volume along a straight line. The sub-volume is moved through the imaging volume together with the patient such that the relative position of the sub-volume and the patient remains constant. The parameters of the image data acquisition, i.e. the speed of movement, the size of the imaging volume, the size of the sub-volume and the resolution need to be selected such that the time of movement of the sub-volume within the imaging volume is sufficient to perform magnetic resonance image data acquisition with the desired resolution.

In step 202 magnetic resonance data acquisition for the sub-volume j is performed while the sub-volume moves through the imaging volume. This can be done by a 3D image data acquisition method or by a multislice imaging method. This will be explained in more detail with respect to FIGS. 3 to 9 and 10, respectively.

When the data acquisition for the sub-volume j has been completed the index j is incremented in step 204 and the control goes back to step 200. In step 200 a subsequent sub-volume j is selected which neighbours the preceding sub-volume. For this sub-volume j another step of data acquisition is performed in step 202 and j is incremented again in step 204, etc.

This process goes on until all image data for the section of interest of the patient's body have been acquired.

It is a particular advantage of the present invention that the patient moves through the magnetic field at a relatively high speed and that the magnetic field can be relatively small. This increases the patient's comfort during the image data acquisition as a psychological "tunnel effect" which may be caused by the patient's stay within the magnetic bore is eliminated or reduced.

The speed of image acquisition and thus the speed of movement can be further increased by application of a parallel imaging technique such as SENSE.

Figure 3:
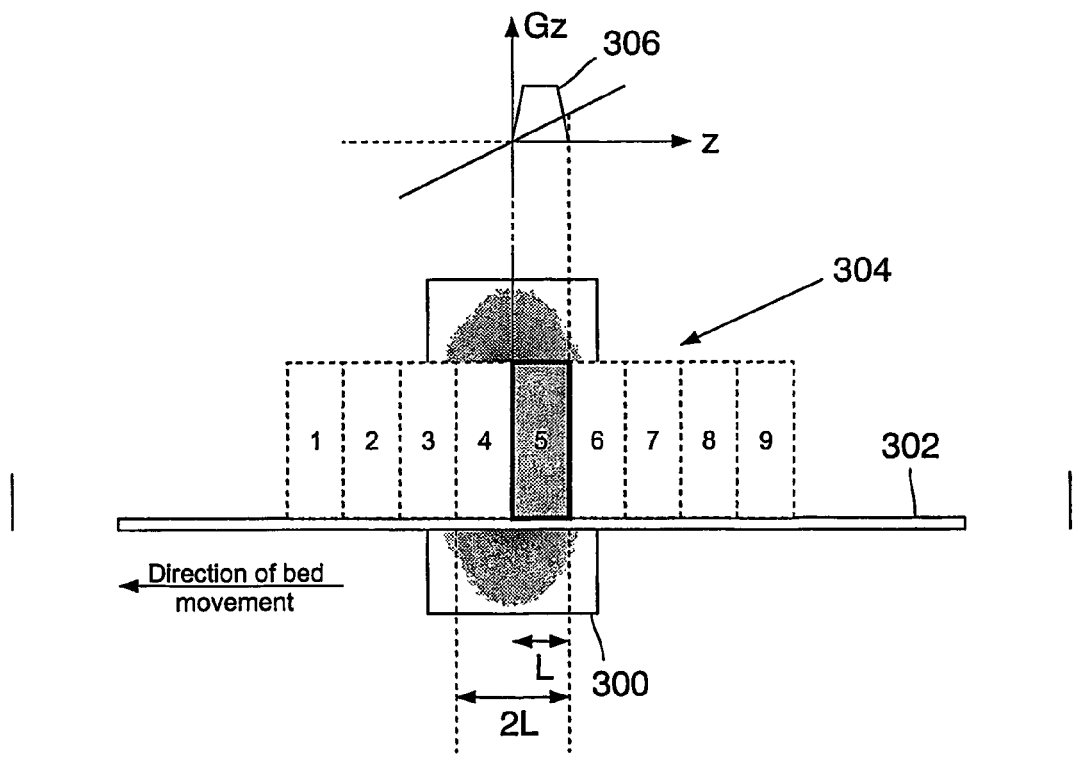
FIG. 3 is illustrative of 3D imaging.

FIG. 3 is illustrative of the 3D imaging case. A homogenous imaging volume is formed within the magnetic field provided by the magnetic bore of the magnetic resonance device (cf. magnetic resonance device 1 of FIG. 1). The imaging volume 300 is considered to be homogenous in a radial manner and truncated in homogeneity along the direction of motion of the patient support bed 302. In cylindrical magnets this is referred to as the z-axis.

In the example considered here a section 304 of the patient's body is to be imaged. To perform the imaging a sequence of sub-volumes or so called "slabs" j is defined which cover the section 304. In the example considered here there are a number of nine slabs j=1 to j=9.

For magnetic resonance image data acquisition one of the slabs which has just entered the imaging volume 300 is selected—this is slab j=5 in the example considered here. With respect to slab j=5 a sequence of gradient pulses 306 is applied for magnetic resonance image data acquisition while the slab j=5 moves in the direction of bed movement together with the patient along the straight line defined by the patient support 302 and the z-axis.

In other words the active slab volume j=5 is moved through the imaging volume 300 along a straight line with the same speed of movement as the patient while the 3D data acquisition is performed for this slab j=5. When the data acquisition for the slab j=5 has been completed a subsequent slab j=6 is selected to perform magnetic resonance image data acquisition with respect to this subsequent slab j=6.

Hence, imaging is performed using a 3D method wherein a slab of thickness L is selected from the section 304 on one side of the imaging volume 300 at the start of the data acquisition for this slab. It is to be noted that the size of the imaging volume 300 needs to be at least two times L in order to be able to accommodate two subsequent sub-volume for seemless and uninterrupted data acquisition.

Preferably a 3D scan utilizes two axes of phase encoding and one axis of frequency encoding. In this method it is preferable that the frequency encoding direction is in the LR (x) direction and the phase encoding directions are in the AP (y) and HF (z) directions, the HF direction being the direction of motion of the patient support.

For example, it is assumed that the total field of view (FOV) to be covered in the z direction is 45 cm. Data acquisition is to be performed in nine slabs each of which has a thickness of L=5 cm. If the final matrix size along the z-axis is to be 225 pixels, than each slab will cover 25 pixels with a resolution of 2 mm per pixel.

The cyclic and continuous data acquisition approach of the present invention has a number of advantages:

There is only one startup and stop period of the bed at the first and last slab, and there are no additional time delays between slab acquisitions. It is also easier to keep the bed moving at a constant rate, once it is moving, thereby reducing the need for accurate knowledge of the bed position.

Data acquisition using continuous bed motion is achieved by "tracking" the slab being imaged, whilst the bed moves. In other words, each encoding step, within a chosen slab, is performed at an incrementally different table position, relative to the homogeneity volume, and the slice selection is also made to exactly follow the table position. As a chosen slab moves with the table, the slice position is updated on either each kz encoding step, or even each TR, so that the same chosen slab is always excited with respect to the extended object, independently of the bed and object position with respect to the homogeneity volume.

An additional requirement, when phase encoding along the slice direction, is the need to remove the zero order phase error that accumulates due to the fact that each z phase encoding step occurs with the slice at a different position with respect to the gradient system. This correction for zero order phase accumulation can be performed by adding an incremental phase offset in the synthesizer which cancels the accumulated phase upon reception. The value of this incremental phase offset is determined from the slice position relative to iso-center and is analogous to frequency offset required for each slice offset.

The speed of the bed is determined by the time required to acquire the whole slab (ky encodings×kz encodings) and the slab thickness L. It is assumed that the homogeneous volume is at least twice as long, in z, as the slab thickness, L, so that the slab traverses the homogeneous region such that its final position is displaced by one complete slab thickness. The order of encoding steps within each loop can be chosen freely (linear or centric for example). The bed position, and slice position (to follow the bed), is incremented either with each increment in kz (assuming kz is the outer most loop) or each TR. When the slice position is updated each TR, any loop order (y in z or vice versa) can be chosen. So, for a slab of thickness L, the time required to travel distance L is M(ky)× N(kz)×TR. Where M(ky) and N(kz) are the number of y and z encodings steps, per slab, respectively.

When the current slab is finally displaced by L all kz encodings are acquired for that slab. The acquisition then begins again at the original slice position with respect to the homogeneous volume. Due to the continuous bed movement, a different portion (the next contiguous slab) of the extended object is now present in the homogeneous volume. Data acquisition continues, with slab tracking, whilst this slab also traverses the homogeneous volume until it is also displaced by a single slab thickness L. The cycle repeats until all slabs have passed through the homogeneous volume.

Figure 4:
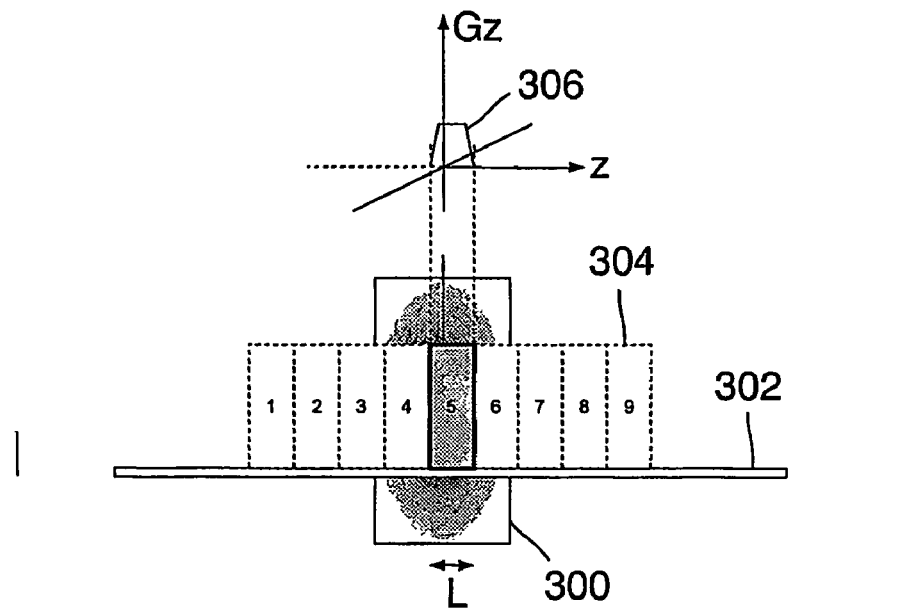
FIGS. 4 to 6 are illustrative of 3D imaging data acquisition for a sub-volume.
Figure 5:
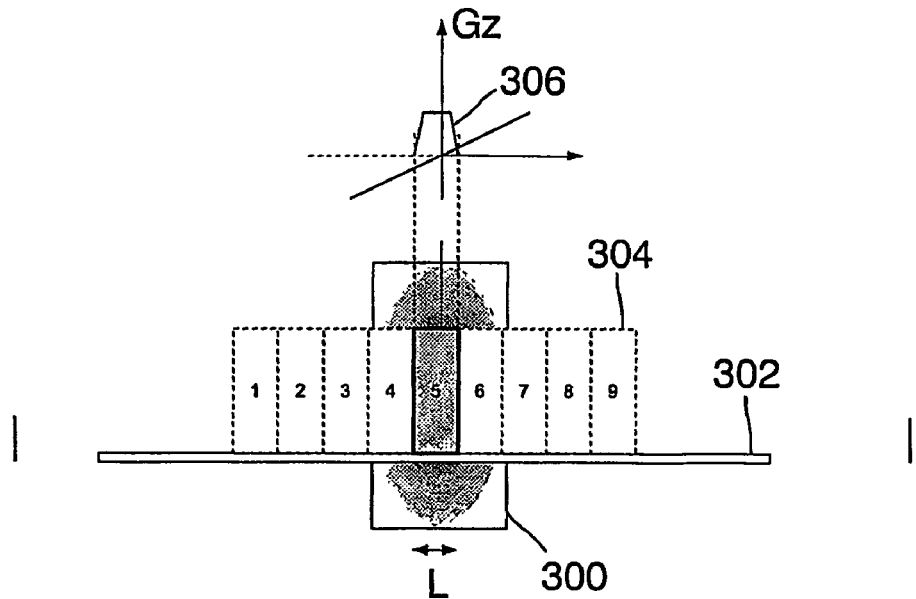
Figure 6:
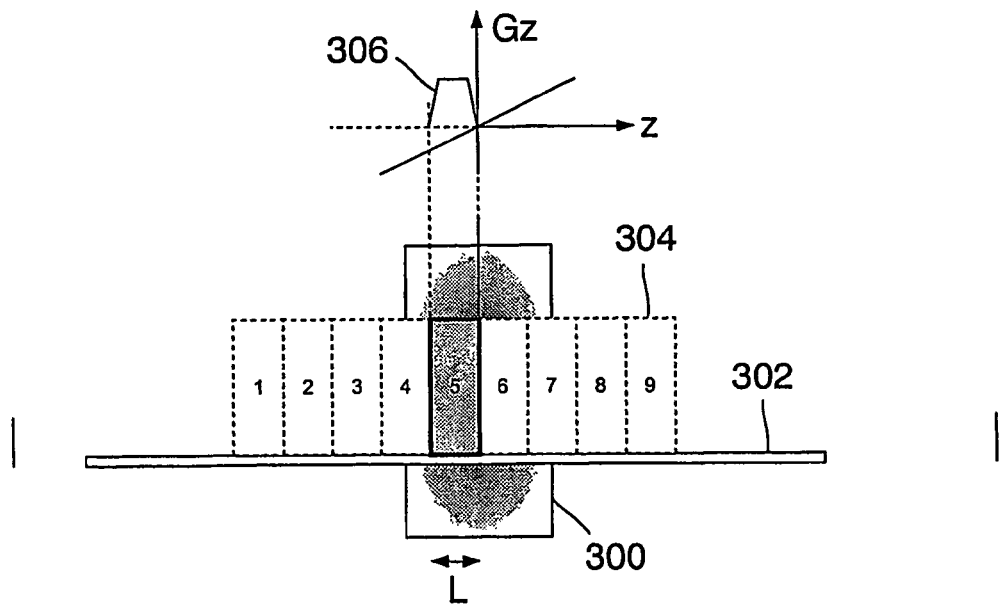

This cyclic process is illustrated in more detail for two consecutive slabs j=5 and j=6 in FIGS. 4 to 9. FIGS. 4, 5 and 6 illustrate the data acquisition process for the slab j=5 at increments i of time TR, where i=m·n.

Figure 7:
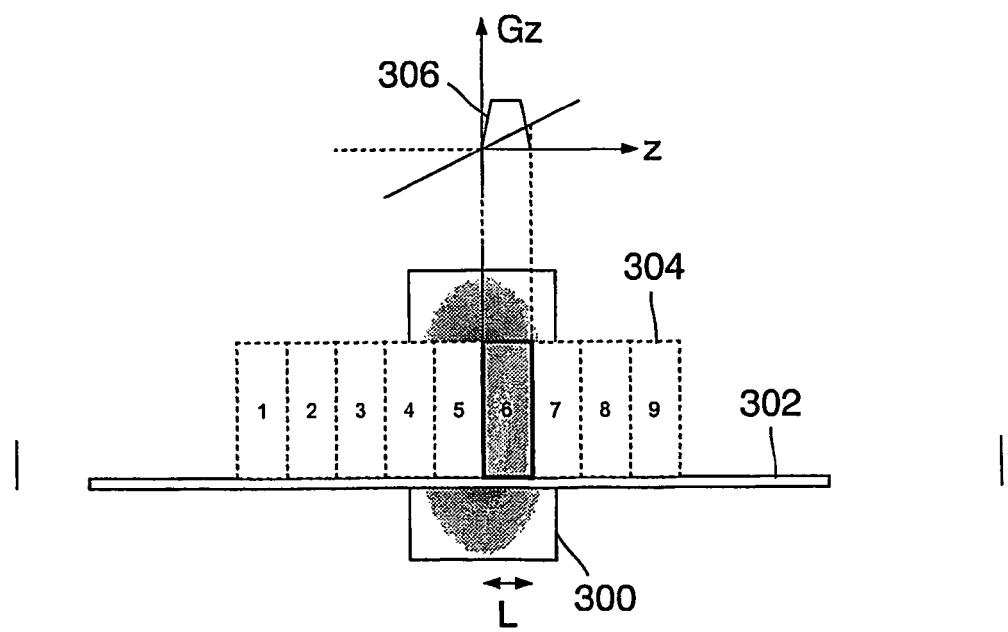
FIG. 7 to 9 are illustrative of 3D image data acquisition for a subsequent sub-volume.
Figure 8:
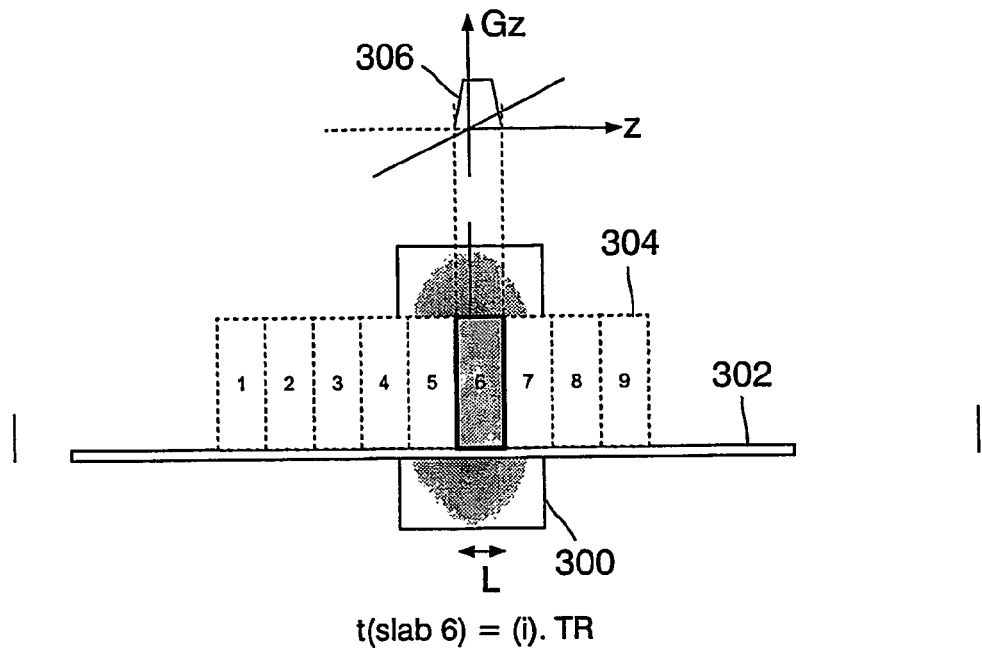
Figure 9:
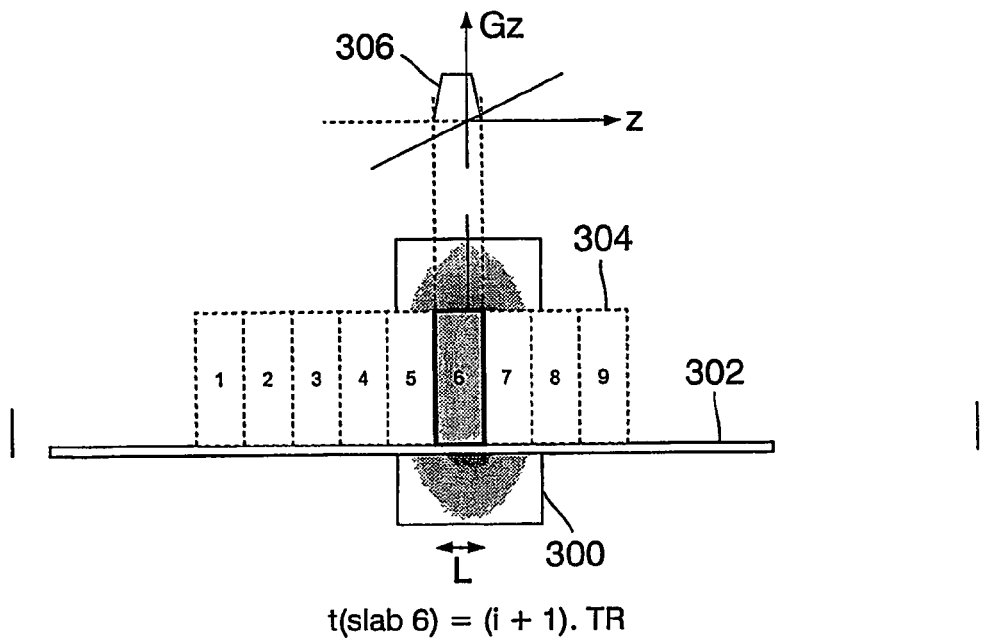

In the position illustrated in FIG. 6 the data acquisition for the slab j=5 has been completed such that the subsequent slab j=6 is selected for the subsequent data acquisition as illustrated in FIGS. 7, 8 and 9.

In the following an application example is described for a slab thickness of L=5 cm where N(kz)=25 and M(ky)=256. For a final matrix size of 256×256×25 per slab, a TR of 8 ms is possible, including motion compensation. The total time per slab is then about 50 seconds, the time per kz encoding step is 2 seconds per step (the time for 256 ky encoding steps). In this case the tracking slice selection position would need to be updated at least every 2 seconds. The bed speed required to traverse 5 cm in 50 seconds is 0.1 cm per second (1 mm per second). The total time required to cover the 9 stations (256× 256×225 matrix) is thus 450 seconds, which is 7:30 minutes. This is a relatively long time. However, by normal means such a scan would take also the same amount of time if the whole 45 cm FOV could be imaged.

It is likely that less encoding steps in ky would be utilized because the body is naturally slimmer in the AP direction. In addition, it is also possible to utilize SENSE in the AP direction using suitable RF coils. A SENSE reduction factor of 2 coupled with a reduction in the number of ky encoding steps from 256 to 192 could result in a total acquisition matrix of just 256×96×25×9 stations which yields an image matrix size of 256×192×225 in a total acquisition time of just 2:50 minutes. In this case the bed speed would be increased to (5 cm in 19 seconds) approximately 2.5 mm per second and the tracking slice position would need to be updated at least each 768 milliseconds.

When the tracking slice position is incremented as a function of the total index, i, of ky×kz (i=m×n, for example). This index runs from 0 to 2400 (for the 96×25 example). In other words, the slice position is changed continuously each TR and thereby tracks the position of the bed exactly. A slice of thickness 5 cm that has to move 5 cm in 2400 steps would move 21 µm each TR.

The extent of the homogenous region along z is not important for the efficiency of this method. Acquisition time is determined purely by the TR and final matrix size. One constraint of this method is that the direction of table movement must always be along the slice selection axis and one axis of the encoding direction. However, the method benefits from the same SNR advantages as standard 3D imaging and is compatible with all 3D acquisition methods including FFE, B-FFE, TSE, GRASE and EPI.

Figure 10:
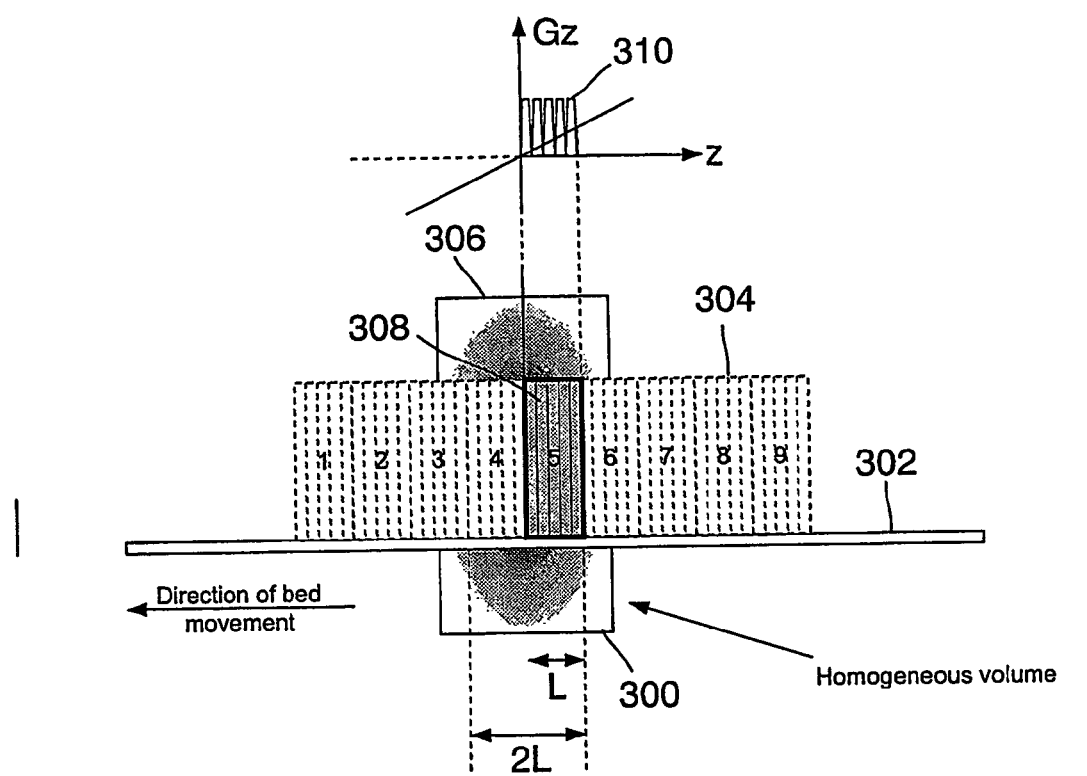
FIG. 10 is illustrative of cyclic multislice imaging.

FIG. 10 illustrates an alternative embodiment which uses a multislice data acquisition technique. In this instance 3D data acquisition is performed by sub-dividing each of the slabs into a number of 2D slices 308. This is reflected by the sequence of gradient pulses 310.

In this case the z phase encoding is dropped and the center of the 2D stack is made to track the table position. Once one 2D stack of slices has traversed the homogeneity volume, the next contiguous stack is available for acquisition in an exactly analogous manner to the 3D case.

The multi-stack 2D approach is advantageous because it exactly mimics the normal case where bed movement is not used. The transition between individual slices, when multiple stacks are concatenated, is also less prone to errors. Since the z phase encoding is dropped, the scan time is likely to be faster although resolution along z is limited by the thickness of each slice within a stack.

It is to be noted that the present invention is particularly advantageous in that it enables possible to image a HF (head to foot) FOV of at least 45 cm within a cylindrical magnet with a homogeneity volume as short as 10 cm along the z direction. By virtue of continuous bed movement, 3D data acquisition and continuous cyclic slice tracking, it is possible to realize this in an identical scan time that would be required if the whole FOV were available. By virtue of the 3D acquisition, the SNR performance is much better than other MR moving bed methods that utilize thin slice acquisitions.

This technique has also be shown to be compatible with a multi-stack 2D acquisition in which each 3D volume is simply replaced by a stack of 2D slices.

The method is compatible with all 2D and 3D MR acquisition methods including FFE, B-FFE, TSE, GRASE, EPI and spiral/radial derivatives.

It is to be noted that while the movement of the patient and the sub-volume through the imaging volume is continuous, the speed of movement can be varied while the data acquisition is performed.

List of Numerals magnetic resonance device 1
magnet system 2
gradient coil 3
supply unit 4
transmitter coil 5
modulator 6
object 7
transmission/reception circuit 9
demodulation unit 10
control unit 11
processing unit 12
monitor 13
imaging volume 300
patient support 302
section 304
gradient pulse 306
slice 308
gradient pulses 310

The invention claimed is:

1. A method of magnetic resonance imaging comprising the steps of:
   a) providing a magnetic field within an imaging volume,
   b) moving a subject continuously along a predetermined path passing through the imaging volume,
   c) defining a sub-volume of the imaging volume that moves together with the subject, the sub-volume being a slab, the slab being selected with an extension along the predetermined path relative to an extension along the predetermined path of the image volume such that the time of movement of the slab across the imaging volume is sufficient for magnetic resonance image data acquisition of the slab with a predefined resolution, d) performing a magnetic resonance image data acquisition for the slab while the slab remains within and moves continuously relative to the imaging volume, the magnetic resonance image data acquisition being a three-dimensional imaging method which includes applying gradient pulses that define the slab which slab moves with the subject;

e) after completing the data acquisition for the slab, defining a subsequent slab which neighbors the slab on the predetermined path and performing a subsequent step of magnetic resonance image data acquisition for the subsequent slab as the subject and the subsequent slab move together continuously through the imaging volume.

2. The method of claim 1, wherein the slab has an extension along the predetermined path between 3 and 7 cm.

3. The method of claim 1, wherein the speed of movement is between 0.5 and 5 mm per second.

4. The method of claim 1, wherein the magnetic resonance image data acquisition is performed by a parallel imaging technique.

5. The method of claim 4 wherein the parallel imaging technique is SENSE-type parallel imaging technique.

6. The method of claim 1, wherein the magnetic resonance image data acquisition is cyclically repeated, such that one repetition is performed for each one of the slabs with the data acquisition for each slab being completed before starting the data acquisition for the subsequent slab.

7. The method of claim 1, wherein each of the slabs has a first extension along the predetermined path, the imaging volume having a second extension along the predetermined path, the second extension being at least twice the first extension.

8. The method of claim 1, wherein the predetermined path is curved.

9. The method of claim 1, further comprising:
correcting the acquired magnetic resonance image data for zero order phase error accumulated due to the continuous moving.

10. The method of claim 1, further comprising:
processing the acquired magnetic resonance image data to form an image of at least a portion of at least one of the slabs; and
visualizing the image.

11. A computer readable medium containing instructions for controlling a computer system for magnetic resonance imaging comprising:
within a magnetic resonance sequence including a gradient pulse sequence, defining a sub-volume of an imaging volume provided by a magnetic field, adjusting the pulse sequence to continuously move the sub-volume along a predetermined path across the imaging volume together with a subject, and performing magnetic resonance image data acquisition for the sub-volume as the sub-volume moves together with the subject, the sub-volume being selected such that the time of movement for the sub-volume to traverse the imaging volume is sufficient for the performing of the magnetic resonance image data acquisition to acquire a full set of imaging data for reconstruction into an image with a preselected resolution, and within the magnetic resonance sequence, after acquiring the full set of image data for the sub-volume, defining a subsequent sub-volume which neighbors the sub-volume on the predetermined path and adjusting the gradient pulse sequence to perform a subsequent step of magnetic resonance image data acquisition from the subsequent sub-volume as the subsequent sub-volume traverses the imaging volume and as the subject and the subsequent sub-volume moves together continuously.

12. The computer readable medium of claim 11, wherein the magnetic resonance sequence employs a parallel imaging technique.

13. A magnetic resonance imaging device comprising:
a magnet system configured to generate a magnetic field within an imaging volume;
a subject support configured for moving a subject continuously along a predetermined path through the imaging volume; and
a control unit configured for generating of control signals for magnetic resonance image data acquisition within a sub-volume of the imaging volume, the sub-volume being moved along the predetermined path along with the subject, the sub-volume being selected such that the time of movement for the sub-volume to track across the imaging volume is sufficient for magnetic resonance image data acquisition with a predefined resolution and for subsequent magnetic resonance image data acquisition within a subsequent sub-volume which neighbors the sub-volume on the predetermined path wherein data acquisition for each sub-volume is completed before data acquisition for a subsequent sub-volume is commenced.

14. The magnetic resonance imaging device of claim 13, wherein the subject support is configured to move the subject with a speed of 0.5 to 5 mm per second.

15. The magnetic resonance imaging device of claim 13 further comprising means for performing a parallel imaging technique based on simultaneous reception through multiple receive channels from the sub-volume as the sub-volume tracks across the imaging volume and subsequently from the subsequent sub-volume as the subsequent sub-volume tracks across the image volume.

16. The magnetic resonance imaging device of claim 13, wherein the control unit is configured to perform cyclic repetitions of the magnetic resonance image data acquisition sequentially, in a non-interleaved fashion, for a plurality of sub-volumes.

17. The magnetic resonance imaging device of claim 13, wherein the sub-volumes each have a first length along the predetermined path and the imaging volume has a second length along the predetermined path, the second length being at least twice the first length.

18. The magnetic resonance imaging device of claim 13, wherein the predetermined path is a straight line and the magnet system includes a cylindrical magnet.

* * * * *